(12) United States Patent
Inaba et al.

(10) Patent No.: US 10,396,023 B2
(45) Date of Patent: Aug. 27, 2019

(54) SEMICONDUCTOR DEVICE

(71) Applicant: FUJI ELECTRIC CO., LTD., Kawasaki-shi, Kanagawa (JP)

(72) Inventors: Yuki Inaba, Matsumoto (JP); Daisuke Inoue, Matsumoto (JP); Shin Soyano, Shiojiri (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/279,681

(22) Filed: Sep. 29, 2016

(65) Prior Publication Data
US 2017/0133308 A1    May 11, 2017

(30) Foreign Application Priority Data

Nov. 6, 2015 (JP) ................. 2015-218622

(51) Int. Cl.
| | |
|---|---|
| *H01L 23/498* | (2006.01) |
| *H01L 23/31* | (2006.01) |
| *H01L 23/367* | (2006.01) |
| *H01L 23/373* | (2006.01) |
| *H01L 23/492* | (2006.01) |

(Continued)

(52) U.S. Cl.
CPC ........ *H01L 23/49838* (2013.01); *H01L 23/13* (2013.01); *H01L 23/3121* (2013.01); *H01L 23/3675* (2013.01); *H01L 23/492* (2013.01); *H01L 23/49822* (2013.01); *H01L 23/49833* (2013.01); *H01L 24/32* (2013.01); *H01L 23/3107* (2013.01); *H01L 23/3735* (2013.01); *H01L 2224/32245* (2013.01); *H01L 2924/13055* (2013.01); *H01L 2924/13091* (2013.01)

(58) Field of Classification Search
None
See application file for complete search history.

(56) References Cited

U.S. PATENT DOCUMENTS

| | | | |
|---|---|---|---|
| 2009/0057929 A1* | 3/2009 | Sasaki | H01L 23/3107 |
| | | | 257/796 |
| 2012/0241953 A1 | 9/2012 | Yamada et al. | |
| 2016/0035646 A1 | 2/2016 | Soyano | |

FOREIGN PATENT DOCUMENTS

| | | |
|---|---|---|
| JP | 2014-57005 A | 3/2014 |
| JP | 5644440 B2 | 12/2014 |

(Continued)

*Primary Examiner* — Joseph C. Nicely
*Assistant Examiner* — Lamont B Koo
(74) *Attorney, Agent, or Firm* — Manabu Kanesaka

(57) ABSTRACT

The semiconductor device includes a multi-layered substrate having an insulating plate and a circuit plate, a semiconductor chip having a front surface attached with a main electrode and a control electrode formed thereon, and a back surface fixed to the circuit plate, a first wiring substrate which includes a first conductive member and is placed so as to face the main electrode connected electrically to first conductive member, a second wiring substrate which includes a second conductive member, is placed so as to face the control electrode, and has an opening, and a conductive post having one end and another end, the one end being connected electrically and mechanically to the control electrode, and the other end being connected electrically and mechanically to the second conductive member. The first conductive member is thicker than the second conductive member, and the first wiring substrate is disposed within the opening.

14 Claims, 10 Drawing Sheets

(51) Int. Cl.
  *H01L 23/00* (2006.01)
  *H01L 23/13* (2006.01)

(56) References Cited

FOREIGN PATENT DOCUMENTS

| | | |
|---|---|---|
| WO | 2011/083737 A1 | 7/2011 |
| WO | 2015/045648 A1 | 4/2015 |

* cited by examiner

SEMICONDUCTOR DEVICE

RELATED APPLICATIONS

The present application is based on, and claims priority from, Japanese Application No. JP2015-218622 filed Nov. 6, 2015, the disclosure of which is hereby incorporated by reference herein in its entirety.

TECHNICAL FIELD

The present invention relates to a semiconductor device.

BACKGROUND ART

One example of power semiconductor modules which are semiconductor devices for controlling large electric current and large voltage is provided with a multi-layered substrate having an insulating plate and circuit plate, a semiconductor chip including a front surface attached with an electrode and a back surface fixed to the circuit plate, and an external terminal, and in addition, it is provided with a printed circuit board and conductive posts, as a wiring member, the printed circuit board facing the front surface of the semiconductor chip and the circuit plate, and the conductive post having one end connected electrically and mechanically to the electrode of the semiconductor chip or the circuit plate and another end connected to the printed circuit board (see JP 2014-57005A). The wiring member provided with the printed circuit board and the conductive posts enable circulating larger electric current than bonding wires do, and in addition, miniaturizing power semiconductor modules.

SUMMARY OF THE INVENTION

Problems to be Solved by the Invention

In the power semiconductor module described in Patent document 1, the semiconductor chip is, for example, an IGBT or a power MOSFET, on the front surface of which are formed a main electrode and a control electrode. Among the plural conductive posts, some conductive posts have one end connected electrically and mechanically to the main electrode, and some other conductive posts have one end connected electrically and mechanically to the control electrode. The printed circuit board to which the other ends of these conductive posts are connected electrically and mechanically has a stacked conductive foil, specifically a copper foil, which is selectively formed on an insulating substrate so as to constitute a predetermined electric circuit.

The copper foil of the printed circuit board generates heat during operation of the power semiconductor module owing to current flowing from the main electrode of the semiconductor chip. The power semiconductor module is designed so that temperature raise of a package caused by the heat generation of the printed circuit board can be controlled within a predetermined range.

In recent years, power semiconductor modules have been oriented to allow applying larger electric current than ever before, and accordingly, in order to control relevant heat generation of printed circuit boards within a range as designed, the thickness of the copper foil of the printed circuit board is proposed to be thickened more than ever before.

The copper foil of the printed circuit board includes a copper foil portion for the main electrode of the semiconductor chip and that for the control electrode thereof, which are formed selectively by etching. The thickness of the copper foil portion for the main electrode and that for the control electrode are the same owing to common production processes of the printed circuit board. Accordingly, when a copper foil of the printed circuit board is thickened more than ever before, the copper foil portion for the control electrode becomes wastefully thick.

However, while large current flows through the copper foil portion for the main electrode of the semiconductor chip, the copper foil portion for the control electrode does not have to allow as large electric current as that flowing through the main electrode. Accordingly, the larger thickness of the copper foil of the printed circuit board than ever before has led to the wasteful thickness of the copper foil portion for the control electrode.

Moreover, when the copper foil of the printed circuit board was thickened more than ever before, it was difficult to form selectively a narrow copper foil portion for the control electrode by etching.

The present invention solves above-described problems advantageously, and an object of the invention is to provide a semiconductor device which can allow large electric current to be applied to the wiring member connected to the main electrode of the semiconductor chip and can prevent the unnecessarily thickened conductive foil of the wiring member connected to the control electrode, and a production method thereof.

Means for Solving the Problems

A semiconductor device of one aspect of the present invention is provided with a multi-layered substrate provided with an insulating plate and a circuit plate, a semiconductor chip provided with a front surface and a back surface, the front surface being attached with a main electrode and control electrode formed thereon, and the back surface being fixed to the circuit plate, a first wiring substrate which includes a first conductive member and is placed so as to face the main electrode connected electrically to first conductive member, a second wiring substrate which includes a second conductive member, is placed so as to face the control electrode, and has an opening, and a conductive post provided with one end and another end, the one end being connected electrically and mechanically to the control electrode, and the other end being connected electrically and mechanically to the second conductive member, wherein the first conductive member is thicker than the second conductive member, wherein the first wiring substrate is disposed inside the opening.

Effects of the Invention

According to the semiconductor device of the present invention, the wiring member connected to the main electrode of the semiconductor chip can allow larger electric current to be applied and can prevent an unnecessarily thickened conductive foil of the wiring member connected to the control electrode.

MODE FOR CARRYING OUT THE INVENTION

Embodiment 1

Figure 1:
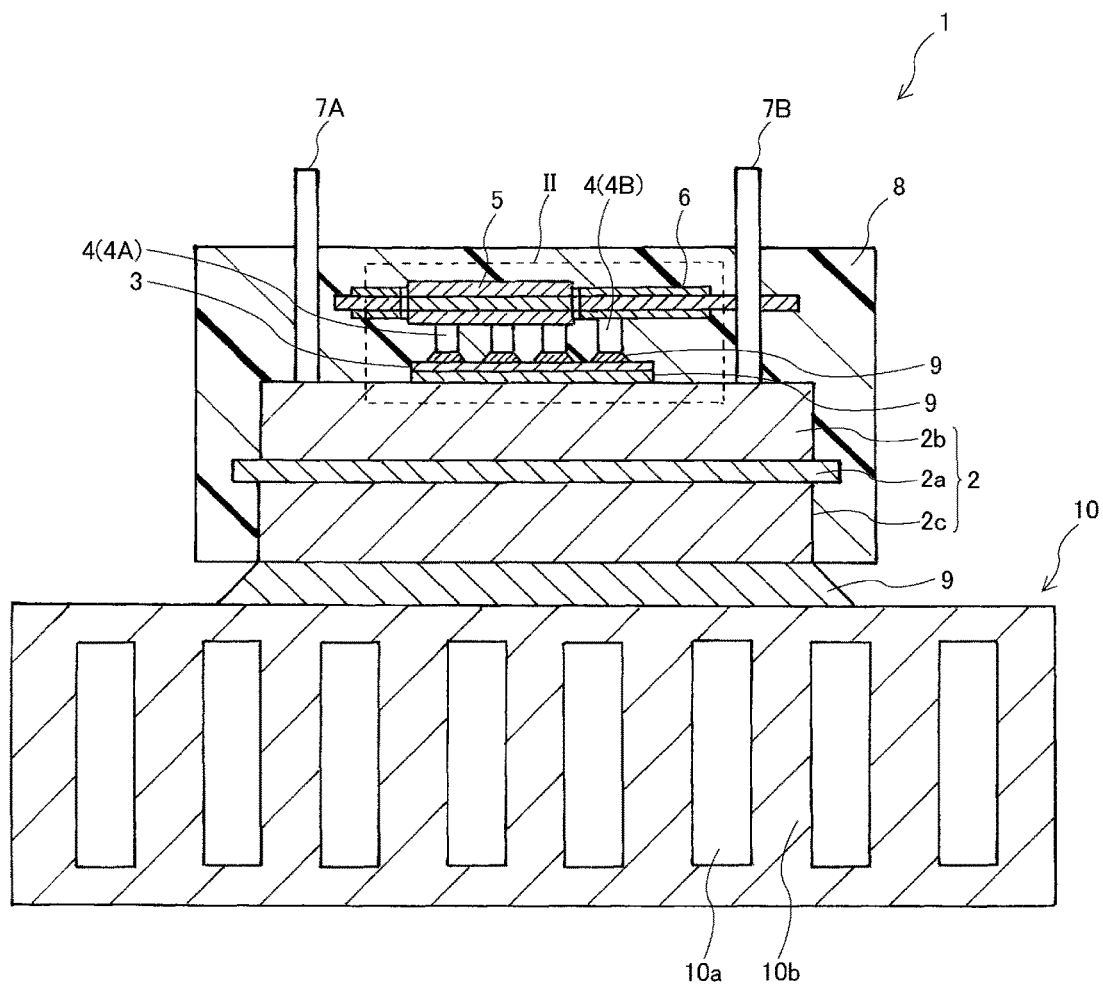
FIG. 1 is a schematical cross-sectional view of a power semiconductor module of one embodiment of the present invention.

Hereinafter, Embodiment 1 of the semiconductor device of the present invention will be specifically explained with reference to the drawing. The term "connected electrically and mechanically" used in the present application is not limited to a case in which subject matters are connected to each other by direct bonding, and the term shall include a case in which the subject matters are connect to each other via electrically conductive bonding material such as solder and a metallic sintered material.

Figure 2:
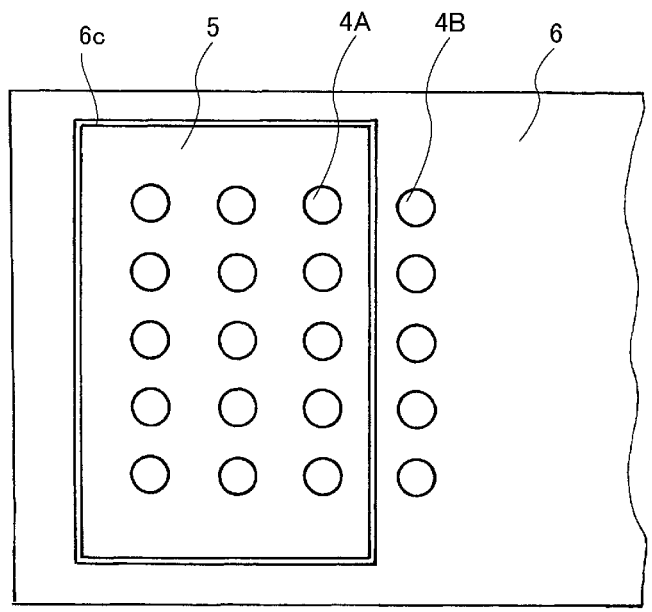
FIG. 2A is a partially enlarged plan view of a main portion of FIG. 1.
FIG. 2B is a partially enlarged cross-sectional view of a main portion of FIG. 1.
FIG. 2C is a flow chart explaining a production method in Embodiment 1 of the present invention.
Figure 2:
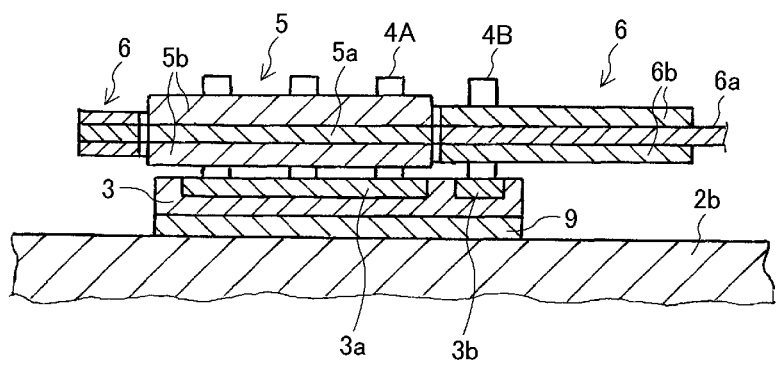
Figure 2:
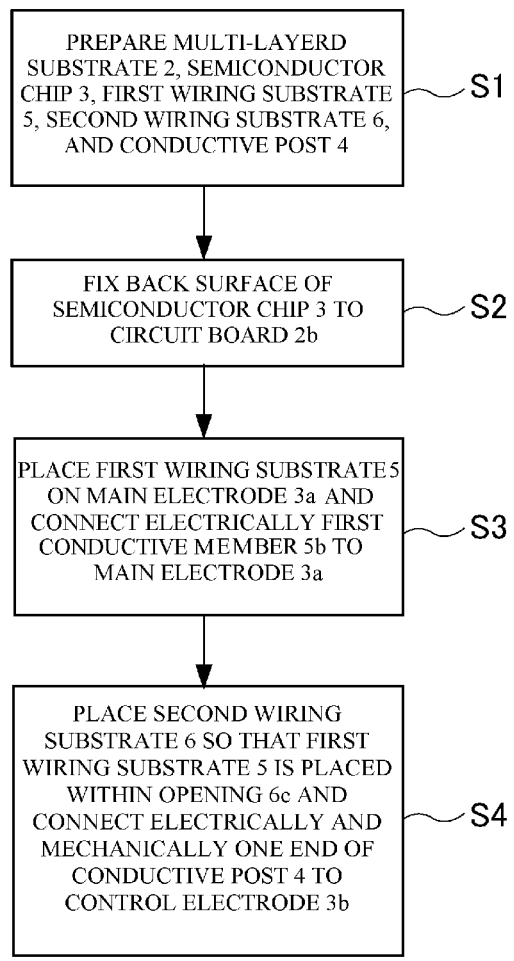

FIG. 1 depicts a schematical cross-sectional view of a power semiconductor module 1 which is a semiconductor device of this embodiment. FIG. 2A, B depict an enlarged cross-sectional view of the portion indicated by II in FIG. 1.

In FIG. 1 and FIG. 2A, B, the power semiconductor module 1 which is a semiconductor device of this embodiment is provided with a multi-layered substrate 2, a semiconductor chip 3, conductive posts 4, a first wiring substrate 5, and a second wiring substrate 6. Further, the power semiconductor module 1 is provided with external terminals 7A, 7B, and a seal resin 8.

The multi-layered substrate 2 is constituted by a stack of an insulating plate 2a, a circuit plate 2b placed on a front surface, in other words, a main surface of the insulating plate 2a, and a metal plate 2c placed on a back surface of the insulating plate 2a. The insulating plate 2a is, for example, made of an insulating ceramic material, such as aluminum nitride, silicon nitride, and aluminum oxide, and the circuit plate 2b and the metal plate 2c are, for example, made of a metal such as copper. For the insulating plate 2a, members other than the ceramic materials can also be used which contain an insulating resin such as polyimide and a glass epoxy material. Further, the circuit plate 2b is selectively formed on the insulating plate 2a, thereby constituting a predetermined electric circuit. A substrate such as a DCB (Direct Copper Bonding) substrate can be used for the multi-layered substrate 2. The DCB substrate is a substrate of an insulating plate 2a to which are bonded directly a circuit plate 2b and a metal plate 2c made of, for example, copper. Since the insulating plate 2a is insulative, the circuit plate 2b and the metal plate 2c are electrically insulated from each other. The semiconductor chip 3 is bonded electrically and mechanically to the front surface of the circuit plate 2b by a bonding material such as solder 9. A cooler 10, as will be described later, is connected thermally and mechanically to the back surface of the metal plate 2c. In the depicted example, this specific means for carrying out the thermal and mechanical connection is a bonding material such as solder 9.

Examples of the semiconductor chip 3 may include, but are not particularly limited to, an IGBT (Insulated Gate Bipolar Transistor), a power MOSFET (Metal Oxide Semiconductor Field Effect Transistor), and FWD (Free Wheeling Diode), and may also include a RB-IGBT (Reverse Blocking-Insulated Gate Bipolar Transistor) and a RC-IGBT (Reverse Conducting-Insulated Gate Bipolar Transistor) which are formed in the vertical direction of a single semiconductor chip. Semiconductors chips made of SiC (for example, SiC-MOSFET) have higher voltage resistance and are capable of switching at higher frequency than those made of silicon.

The semiconductor chip 3 has a vertical type switching element placed on a semiconductor substrate provided with a front surface and a back surface, and the front surface is provided with a main electrode 3a and a control electrode 3b, as shown in FIG. 2B. Further, the semiconductor chip 3 is provided with a main electrode on the back surface thereof (not shown in the figure). For example, when the semiconductor chip 3 is an IGBT, an emitter electrode which is the main electrode 3a and a gate electrode which is the control electrode 3b are formed on the front surface. A collector electrode is formed on the back surface.

The semiconductor chip 3 is not limited to an IGBT and a power MOSFET, and only has to be a combination of one or more semiconductor chips provided with a main electrode and a control electrode on the front surface and capable of switching operation.

The conductive post 4A is a bar-like conductive member provided with one end and another end, and the one end is disposed so as to face the main electrode 3a formed on the front surface side of the semiconductor chip 3. The main electrode 3a is connected electrically and mechanically to the conductive post 4A by, for example, a bonding material such as solder 9. The other end of the conductive post 4A is connected electrically and mechanically to the first wiring substrate 5 disposed so as to face the main electrode 3a of the semiconductor chip 3.

The conductive post 4B is a bar-like conductive member provided with one end and another end, and the one end is placed so as to face the control electrode 3b formed on the front surface side of the semiconductor chip 3. The other end of the conductive post 4B is connected electrically and mechanically to the second wiring substrate 6 disposed so as to face the control electrode 3b of the semiconductor chip 3.

The control electrode 3b is connected electrically and mechanically to the conductive post 4B by, for example, a bonding material such as solder 9. The conductive post 4A and the conductive post 4B are pin-shaped, for which is suitably used a metal material having low electrical resistance and high thermal conductivity, and copper or aluminum is specifically desirable. Plural conductive posts 4A and plural conductive posts 4B are preferably disposed for the main electrode 3a and the control electrode 3b of the one semiconductor chip 3, respectively. Thermal conductivity can be thus improved.

The conductive post 4A is connected electrically and mechanically to the first wiring substrate 5 by, for example, press-fit of the conductive post 4A into a hole formed in a predetermined location of the first wiring substrate 5. The conductive post 4B is connected electrically and mechanically to the second wiring substrate 6 by, for example, press-fit of the conductive post 4B into a hole formed in a predetermined location of the first wiring substrate 6. Soldering, brazing, or swage can be carried out in place of the press-fit.

The first wiring substrate 5 is disposed so as to face the main electrode 3a of the semiconductor chip 3. In addition, the second wiring substrate 6 is disposed so as to face the control electrode 3b of the semiconductor chip 3. As shown in FIG. 2A, the second wiring substrate 6 has an in-plane opening 6c, and the first wiring substrate 5 is disposed within this opening 6c. The first wiring substrate 5 is preferably in contact with the inside of this opening 6c. The first wiring substrate 5 and the second wiring substrate 6 may be disposed so as to be located on the same plane. Although, in the depicted example, the plan-view shape of the opening 6c is rectangular, various shapes for easy fixing of the first wiring substrate 5 can be adopted, and they may be polygonal, circular, elliptical, and so on.

As shown in FIG. 2B, the first wiring substrate 5 is constituted by a stack of a first insulating substrate 5a and first conductive members 5b disposed on the both side of the first insulating substrate 5a. In the depicted example, the first conductive member 5b of the first wiring substrate 5 is formed thoroughly on the first insulating substrate 5a. The first insulating substrate 5a to be used can be those made of an insulating resin such as polyimide and those made of a glass epoxy material and a ceramic insulating plate. The first conductive member 5b is, for example, a copper foil. The first conductive member 5b of the first wiring substrate 5 may be formed on either of the surfaces of the first insulating substrate 5a, but it is preferably formed on each of the both surfaces of the first insulating substrate 5a in order to prevent warpage of the first wiring substrate 5 and to improve electromagnetic shielding property. In the depicted example, the plan-view shape of the first wiring substrate 5 is rectangular, but it may be polygonal, circular, elliptical, and so on.

The second wiring substrate 6 is constituted by a stack of a second insulating substrate 6a and second conductive members 6b disposed on the both surfaces of the second insulating substrate 6a. In the depicted example, the second conductive member 6b of the second wiring substrate 6 is selectively formed on the second insulating substrate 6a so as to form a predetermined wiring for constituting an electric circuit. Note that FIG. 2A omits illustration of the wiring pattern constituted by the selective formation of the second conductive member 6b. The power semiconductor module 1 can be miniaturized by shortening the second conductive member 6b of second wiring substrate 6. In addition, the arrangement of the control terminal can be changed, according to customer requirements, by changing only the wiring of the second conductive member 6b of the second wiring substrate 6. The first wiring substrate 5 and the second wiring substrate 6 are preferably disposed so that the side surface of the first insulating substrate 5a faces the internal side surface of the opening 6c of the second insulating substrate 6a. Further, any method for fixing the first wiring substrate 5 and the second wiring substrate 6 to each other may be used so long as the first conductive member 5b is not connected electrically to the second conductive member 6b. For example, a protrusion formed along the second insulating substrate 6a within the opening 6c may be fitted to the side face of the first insulating substrate 5a, to align and fix the both substrates. Further, an insulating sheet or spacer may be inserted into a space between the opening 6c of the second wiring substrate 6 and the first wiring substrate 5, to fix the both substrates.

The second insulating substrate 6a to be used can be those made of an insulating resin such as polyimide and those made of a glass epoxy material and a ceramic insulating plate. The second conductive member 6b is, for example, a copper foil. The second conductive member 6b of the second wiring substrate 6 may be formed on either of the surfaces of the second insulating substrate 6a, but it is preferably formed on each of the both surfaces of the second insulating substrate 6a in order to prevent warpage of the second wiring substrate 6 and to improve electromagnetic shielding property.

The thickness of first conductive member 5b of the first wiring substrate 5 is larger than that of the second conductive member 6b of the second wiring substrate 6. The larger thickness of the first conductive member 5b of the first wiring substrate 5 enables inhibiting heat generation of the first conductive member 5b even when a large electric current of 200 A (ampere) or 400 A is applied to the first conductive member 5b.

In addition, since the thickness of the second conductive member 6b of the second wiring substrate 6 is relatively thinner than that of the first conductive member 5b of the first wiring substrate 5, the thickness of the second conductive member 6b through which an electric current of a few A flows does not have to be wastefully the same as that of the first conductive member 5b of the first wiring substrate 5, and moreover, the second conductive member 6b can be easily formed selectively by etching in order to constitute an electric circuit.

The thickness of the first conductive member 5b is that in the direction of the stack of the first insulating substrate 5a and the first conductive member 5b. The thickness of the second conductive member 6b is that in the direction of the stack of the second insulating substrate 6a and the second conductive member 6b.

The external terminals 7A, 7B of the power semiconductor module 1 are terminals connecting electrically, to the exterior, the main electrode 3a among other things on the front and back surfaces of the semiconductor chip 3, and main electrical power is transmitted by the terminals. One end of the exterior terminals 7A, 7B is connected electrically to the circuit plate 2b of the multi-layered substrate 2, for example, by a bonding material such as solder 9. The other end of the exterior terminals 7A, 7B is extracted outward from the upper surface of a seal resin 8 forming an outer shape of the power semiconductor module 1. Input and output of main electricity from the exterior is carried out via the external terminals 7A, 7B. The power semiconductor module 1 is provided with a non-illustrated control terminal other than the external terminals 7A, 7B. The control terminal is a terminal for controlling the semiconductor chip 3, and one end the terminal is connected electrically, via the second wiring substrate 6, to the control electrode 3b formed on the front surface of the semiconductor chip 3.

The seal resin 8 seals at least the semiconductor chip 3, the multi-layered substrate 2, the first wiring substrate 5, the second wiring substrate 6, the conductive post 4A, and the conductive post 4B. The seal resin 8 has no particular limitation so long as it is a resin having, for example, a predetermined insulation performance and a predetermined moldability, and thermosetting resins can be used. The seal resin 8 to be used can be specifically a resin such as an epoxy resin or a maleimide resin. Further, a filler made of a highly thermally conductive material can be added to the resin in order to enhance heat dissipation. For the filler, a material such as alumina or boron nitride can be applied.

In this embodiment, the seal resin 8 forms the outer shape, in other words, the housing, of the power semiconductor module 1, which is not provided with any other case. Shaping the seal resin 8 can be carried out by molding, more specifically, transfer molding, but it is not limited to transfer molding. For example, the shaping can be carried out by potting of the resin. In addition, the power semiconductor module 1 is not limited to the depicted example, and it may also be configured so as to be provided with an additional case other than the sealing resin.

The metal plate 2c of the multi-layered substrate 2 is fixed on the front surface of a cooler 10. The cooler 10 is provided with plural fins 10b in its internal space. The space between the fins 10b acts as a cooling channel 10a. A cooling medium is circulated from outside into this cooling channel 10a. The cooling medium does not have any particular limitation, and not only a liquid refrigerant such as aqueous ethylene glycol and water can be used, but also a vapor refrigerant such as air can be used, and moreover, a phase-changeable refrigerant can be used, such as chlorofluorocarbon, which evaporates in the cooler to cool it by heat of evaporation. Attachment of the cooler 10 to the metal plate 2c is carried out, in the depicted example, by bonding using a bonding material such as solder 9. Bonding the cooler 10 to the metal plate 2c by the solder 9 enables transmitting, to the cooler 10, heat which propagates from the semiconductor chip 3 to the multi-layered substrate 2.

The solder 9 to be used for bonding the semiconductor chip 3 and the circuit plate 2b, the solder 9 to be used for bonding the semiconductor chip 3 and the conductive post 4A or 4B, and the solder 9 to be used for bonding the cooler 10 and the metal plate 2c can be solder materials, such as Sn—Ag, Sn—Cu, Sn—Sb, and Sn—Sb—Ag solder materials. In the power semiconductor module 1, the same material can be used as the solder 9 for each bonding, and for example, different solder materials may also be used as the solder 9 for bonding the semiconductor chip 3 and the circuit plate 2b and as the solder 9 bonding the semiconductor chip 3 and the conductive post 4A, and so on.

The power semiconductor module 1 has the thicker first conductive member 5b of the first wiring substrate 5 than the second conductive member 6b of the second wiring substrate 6, as described above.

In general, heat generation during electric current flow in a conductor follows the Joule law, $$Q = I^2 \cdot R \cdot t,$$

where Q is heat quantity, I is electric current, R is resistance, and t is energization time.

Further, the resistance R of the conductor is represented by the following formula, $$R = \rho \cdot L / S,$$

where R is resistance, ρ is electric resistivity, L is the length of the conductor, and S is the cross-section of the conductor.

The above-described two formulae show that, in order to reduce heat quantity of a conductor to which electric current is applied, smaller electric resistivity, shorter wiring path, and larger cross-section are effective.

In product design, heat generation due to energization has to be set to be less than a certain heat quantity, and in a wiring substrate constituting a part of a circuit of main electric current of the semiconductor chip 3, it may be difficult to apply larger electric current owing to an upper limit of the thickness of a conductive member, which upper limit is determined by productive constraints of the wiring substrate. In addition, even when a thicker conductive member was able to be achieved, it led to increased force necessary for press-fit of the conductive post, higher production cost, and moreover, difficulty to form, by selective etching, conductive members for narrow control electrodes.

Accordingly, in order to solve the above problems, it is effective to constitute a wiring substrate by the first wiring substrate 5 and the second wiring substrate 6, with the first conductive member 5b of the first wiring substrate 5 being thicker than the second conductive member 6b of the second wiring substrate 6.

Next, a production method of the power semiconductor module 1 according to Embodiment 1 is explained by using FIG. 2C.

First, there are prepared a multi-layered substrate 2 provided with an insulating plate 2a and circuit plate 2b, a semiconductor chip 3 provided with a front surface and a back surface and having a main electrode 3a and a control electrode 3b on the front surface, a first wiring substrate 5 including a first conductive member 5b, a second wiring substrate 6 including a second conductive member 6b thinner than the first conductive member 5b and having an opening 6c, and a conductive post 4B provided with one end and another end which is connected electrically and mechanically to the second conductive member 6b (S1).

Then, the back surface of the semiconductor chip 3 is fixed to the circuit plate 2b (S2); the first wiring substrate 5 is disposed so as to face the main electrode 3a, and the first conductive member 5b is connected electrically to the main electrode 3a (S3); the second wiring substrate 6 is disposed so as to face the control electrode 3b so that the first wiring substrate 5 is located within the opening 6c, and one end of the conductive post 4B is connected electrically and mechanically to the control electrode 3b (S4).

In such a production method, the first wiring substrate 5 is preferably provided with a first insulating substrate 5a having a front surface and back surface, and the first conductive member 5b is preferably formed on at least any one of the front surface and the back surface of the first insulating substrate 5a. In addition, the second wiring substrate 6 is provided with a second insulating substrate 6a having a front surface and a back surface, and the second conductive member 6b is preferably formed on at least any one of the front surface and the back surface of the second insulating substrate 6a. Further, an opening 6c is preferably placed on the second insulating substrate 6a.

Embodiment 2

Next, Embodiment 2 of the semiconductor device of the present invention is specifically explained with reference to the drawing.

Figure 3:
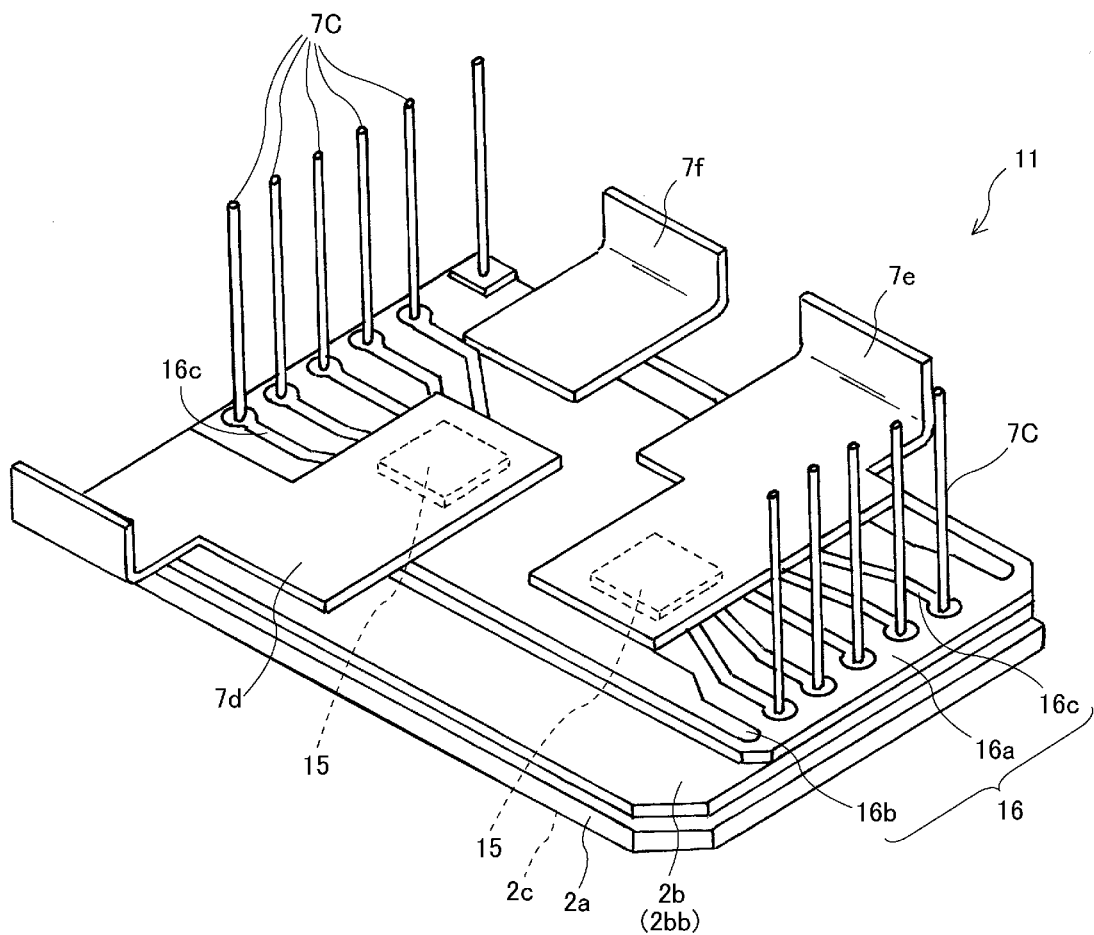
FIG. 3 is a perspective view of a main portion of a power semiconductor module of another embodiment of the present invention.

FIG. 3 depicts a main portion of the power semiconductor module 11 which is a semiconductor device of this Embodiment 2, as a perspective view. For better understanding, FIG. 3 omits illustration of the external terminal 7A, the external terminal 7B, and the seal resin 8, and depicts an aspect of the main portion before sealed by the seal resin 8. In the following drawings, the same symbols are assigned to the same members as those depicted in FIG. 1 and FIG. 2A, B. Accordingly, among the following explanations, duplicated explanations will be omitted for already explained members.

In FIG. 3, the module is provided with two semiconductor chips 3 (not appearing in the drawing). The semiconductor chip 3 is, for example, an RC-IGBT. The RC-IGBT includes an IGBT element and a FWD element on one chip.

The semiconductor chip 3 (not appearing in the drawing) is connected electrically and mechanically to the circuit plate 2b of the multi-layered substrate 2. A metal blocks 15 as a first wiring substrate is connected electrically and mechanically to the main electrode 3a (not appearing in the drawing) formed on the front surface of this semiconductor chip 3. In addition, a printed circuit board 16 as a second wiring substrate is disposed so as to face the control electrode 3b (not appearing in the drawing) formed on the front surface of the semiconductor chip 3, and the control electrode 3b and second copper foil portions 16c of the printed circuit board 16 is connected electrically via the conductive post 4B.

The narrow second copper foil portion 16c formed for the control electrode is selectively formed on a flexible insulating plate 16a of the printed circuit board 16, and one end (upper end) of the conductive post 4B is connected, by press-fit among other things, electrically and mechanically to one longitudinal end of the second copper foil portion 16c. One end (lower end) of an external terminal 7C as a control terminal is bonded, by a bonding material such as solder 9, to the other longitudinal end of the second copper foil portion 16c. The flexible insulating plate 16a corresponds to the second insulating substrate of the present invention, and the second copper foil portion 16c corresponds to the second conductive member of the present invention.

A wide lead terminal 7d is bonded, by laser weld among other things, to the one metal block 15 of the semiconductor chip 3. A wide lead terminal 7e is bonded, by laser weld among other things, to the other metal block 15 of the semiconductor chip 3. A wide lead terminal 7f is bonded, by laser weld among other things, to the circuit plate 2b of the multi-layered substrate 2.

Figure 4:
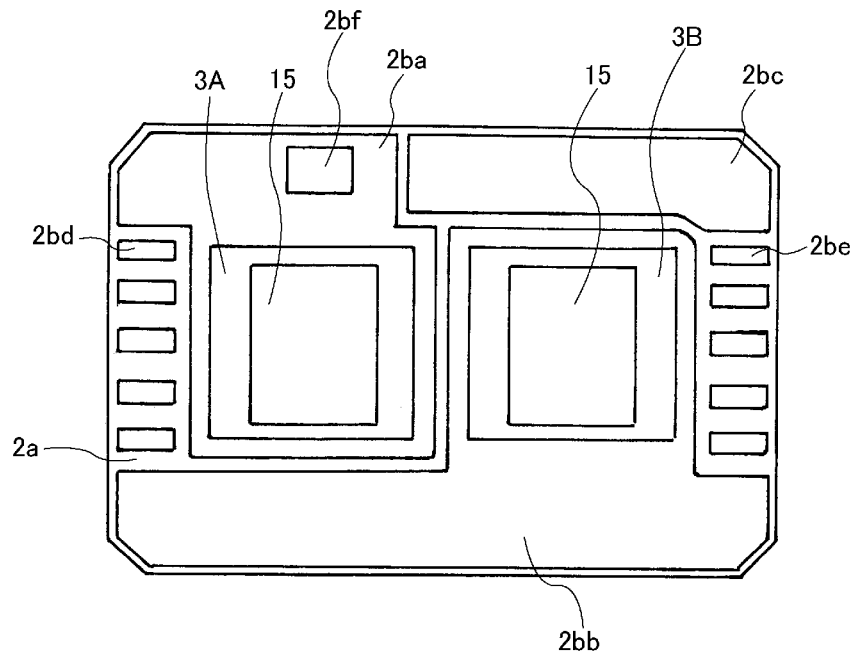
FIG. 4 is a plan view of a member of the power semiconductor module of FIG. 3.

FIG. 4 is a plan view omitting the printed circuit board 16, the lead terminal 7d, the lead terminal 7e, and the lead terminal 7f among the members depicted in FIG. 3. In other words, in FIG. 4, the insulating plate 2a and the circuit plate 2b of the multi-layered substrate 2, the semiconductor chip 3, and the metal block 15 appear in the drawing. In FIG. 4, the circuit plate 2b is divided into a first circuit portion 2ba, a second circuit portion 2bb, a third circuit portion 2bc, a fourth circuit portion 2bd, and a fifth circuit portion 2be.

The first circuit portion 2ba is connected electrically to a main electrode on the back surface of the semiconductor chip 3A. This first circuit portion 2ba is provided with a protruded portion 2bf, and the top surface of this protruded portion 2bf is laser-bonded to the lead terminal 7f. The second circuit portion 2bb is connected electrically to a main electrode of the back surface of the other semiconductor chip 3B. The fourth circuit portion 2bd is disposed in a location facing the lower end of the external terminal 7C. The fourth circuit portion 2bd may be or may not be connected electrically to the external terminal 7C. The fifth circuit portion 2be is disposed in a location facing the lower end of the external terminal 7C. The fifth circuit portion 2be may be or may not be connected electrically to the external terminal 7C.

The two RC-IGBTs are disposed on the multi-layered substrate 2 and connected to the circuit plate 2b, the metal block 15, the lead terminal 7d, the lead terminal 7e, the lead terminal 7f, and the printed circuit board 16, to constitute lower and upper arms of an inverter circuit. Two electrically parallely connected pairs of semiconductor chips 3 may be disposed on one multi-layered substrate 2, to constitute an upper arm and a lower arm in one phase constituting an inverter circuit.

Figure 5:
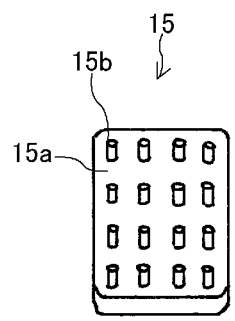
FIG. 5A is a perspective view of a metal block depicting a surface of a side facing a semiconductor chip.
FIG. 5B is a perspective view of a metal block depicting a surface of a side bonded to a lead terminal.
Figure 5:
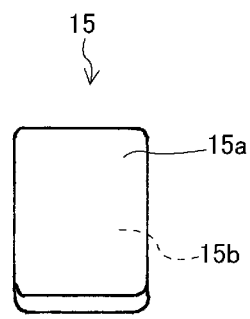

FIG. 5A is a perspective view for the metal block 15 depicting the surface of a side facing the semiconductor chip 3, and FIG. 5B is a perspective view depicting the surface of a side bonded to the lead terminal 7d or the lead terminal 7e. As shown in FIG. 5A, B, the metal block 15 of the illustrated example has a planar and roughly rectangular shape of approximately the same area as that of the main electrode 3a of the semiconductor chip 3, and has a plate-like base portion 15a having a predetermined thickness and plural pin portions 15b protruding from this base portion 15a. The base portion 15a may be roughly a rectangular parallelepiped shape. The tip of the pin portion 15b is connected electrically and mechanically to the main electrode 3a of the semiconductor chip 3 by a bonding material such as solder 9. The metal block 15 is an electrically conductive and thermally conductive metal such as copper and aluminum. The thickness of the base portion 15a, in other words, the distance between the surface of the side facing the semiconductor chip 3 in the base portion 15a and the surface of the side bonded to the lead terminal 7d or the lead terminal 7e is larger than the thickness of a first copper foil portion 16b of the printed circuit board 16. Accordingly, the metal block 15 allows circulation of large electric current. The metal block 15 is made of a heat dissipative material, and moreover, it can radiate heat in a space between each of the pins in the pin portion. Accordingly, using the metal block 15 enables inhibiting heat generation during energization.

The shape of each of the pins in the pin portion 15b is not particularly limited to the illustrated cylindrical shape and may be a prismatic or fin-like shape.

Since the metal block 15 is used, a force necessary for press-fit of the conductive post into the copper foil is not required unlike in the case of conventional semiconductor devices where printed circuit boards with thick copper foil are used, and therefore, the conductive post is prevented from breaking or bending.

Variations of the metal block 15 of this embodiment include a metal block without the pin portion 15b. In other words, they may be plate-like metal blocks having only the base portion 15a. In this case, a plate-like metal block penetrated by a hole in its thickness direction is also a variation of the metal block 15 of this embodiment.

Figure 6:
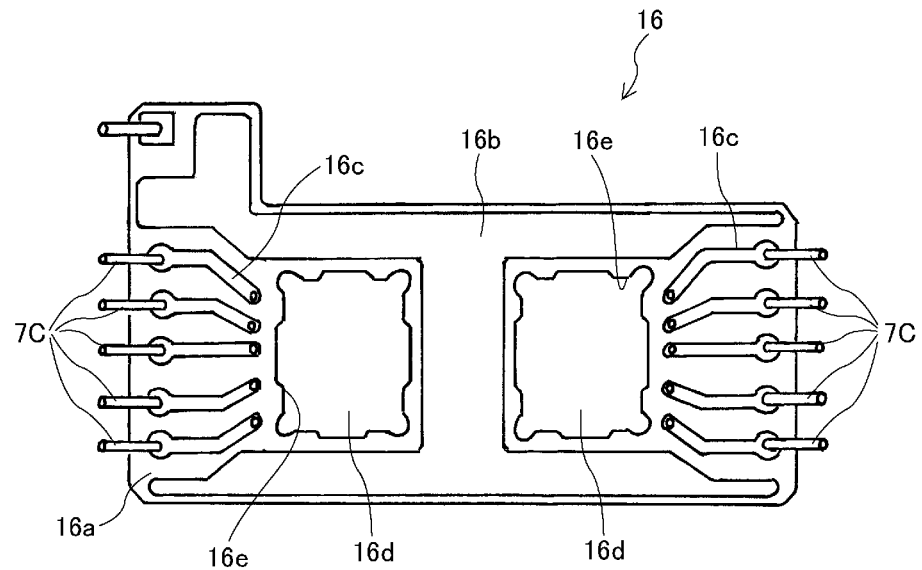
FIG. 6 is a plan view of a printed circuit board.
Figure 7:
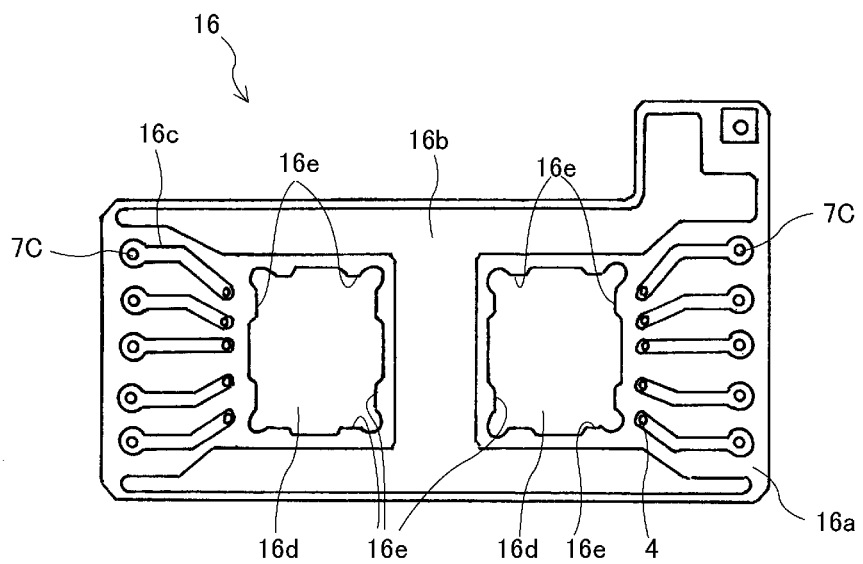
FIG. 7 is a backside view of the printed circuit board.

FIG. 6 is a front side view of the printed circuit board 16, and FIG. 7 is a back side view of the printed circuit board 16. In FIG. 6 and FIG. 7, the printed circuit board 16 is a board in which the first copper foil portion 16b and the second copper foil portion 16c are selectively formed on the both surfaces of the flexible insulating plate 16a. However, the first copper foil portion 16b and the second copper foil portion 16c may be formed on only one of the surfaces.

By shortening the second copper foil portion 16c of the printed circuit board 16, the power semiconductor module 1 can be miniaturized. In addition, by changing the wiring of the second copper foil portion 16c, the arrangement of the control terminals can be changed according to customer requirements.

The flexible insulating plate 16a is made of a flexible insulating resin, and for example, polyimide resins can be used. The flexible insulating plate 16a has an opening 16d formed for insertion and penetration of the metal block 15. Plural tongue pieces 16e are formed along the periphery of the opening 16d. By the insertion and penetration of the metal block 15, the tongue pieces 16e come in contact with the side surface of the metal block 15 and are forced into taking a warped shape. The metal block 15 and the printed circuit board 16 may be disposed so as to be located on the same plane. The printed circuit board 16, kept aligned to the metal block 15, is thus fixed integrally thereto. The shape of the tongue piece 16e is not limited to the illustrated example.

Portions other than the tongue pieces 16e in the opening 16d are portions forming a gap when the metal block 15 is inserted into and put through the opening 16d. The gap is defined by the tongue piece 16e. Formation of the gap defined by the tongue piece 16e enables the flow of the seal resin 8 through the gap during molding of the seal resin 8.

The second copper foil portion 16c is formed into a narrow shape for the control electrode, as explained by using FIG. 3, on the flexible insulating plate 16a of the printed circuit board 16. One end (upper end) of the conductive post 4B is connected electrically and mechanically, for example by press-fit, to one longitudinal end of the second copper foil portion 16c. The spacing between the printed circuit board 16 and the multi-layered substrate is determined by the length of the conductive post 4B, the one end of which is bonded to the second copper foil portion 16c, and the other end of which is bonded to the control electrode 3b of the semiconductor chip 3.

A hole penetrating the printed circuit board 16 in its thickness direction is formed on the other longitudinal end of the second copper foil portion 16c, and one end (lower end) of the external terminal 7C is inserted into this throughhole and connected electrically and mechanically, by pressfit or a bonding material such as solder 9. The lower end of the external terminal 7C may be or may not be in contact with the fourth circuit portion 2bd or the fifth circuit portion 2be of the multi-layered substrate 2.

The first copper foil portion 16b is formed on the flexible insulating plate 16a within a region which is near the opening 16d and neither interferes in the second copper foil portion 16c nor hampers the deformation of the tongue piece 16e. The first copper foil portion 16b prevents the deformation of the printed circuit board 16 and improves the electromagnetic shielding property.

The power semiconductor module 11 of this embodiment is provided with the metal block 15 and the printed circuit board 16, and the thickness of the base portion 15a of the metal block 15 is larger than that of the second copper foil portion 16c of the printed circuit board 16. In one example, the thickness of the base portion is about 0.5-3.0 mm. When the thickness of the base portion is 0.5 mm or more, heat generation of the metal block 15 can be inhibited even in the case of large electric current flowing through the metal block 15. When the thickness of the base portion is 3.0 mm or less, the main electrode 3a is bonded to the pin portion 15b of the semiconductor chip 3 via the solder 9 having an appropriate thickness, thereby ensuring reliability of the power semiconductor module 11.

Further, the thickness of the first copper foil portion 16b of the printed circuit board 16 is not as large as that of the base portion 15a of the metal block 15, and in one example, the thickness of the first copper foil portion 16b is about 0.1-0.3 mm. When the thickness of the first copper foil portion 16b is 0.1 mm or more, a second copper foil portion 16c can be formed which only has to be of a thickness necessary and sufficient to circulate electric current for control. In addition, when the thickness of the first copper foil portion 16b is 0.3 mm or less, the second copper foil portion 16c can be easily and selectively formed by etching which is to be formed simultaneously with the first copper foil portion 16b in order to constitute an electric circuit.

Moreover, the opening 16d is formed on the printed circuit board 16, and by putting the metal block 15 through the opening 16d, the location of the control electrode 3b in the semiconductor chip 3 connected to the metal block 15 can be aligned to the location of one end of the conductive post 4B connected to one end of the second copper foil portion 16c of the printed circuit board 16 so that the locations face each another. In other words, the location of the control electrode 3b and the that of the one end of the conductive post 4B can be aligned automatically and precisely without any jig for the alignment merely by penetrating the metal block 15 into the opening 16d of the printed circuit board 16. Accordingly, power semiconductor modules with high reliability can be produced at low cost. A result of fabricating the power semiconductor module 11 of Embodiment 2 has indeed shown that the location of the control electrode 3b was able to be aligned automatically and precisely to that of the one end of the conductive post 4B.

In particular, a power semiconductor module 11 in which the tongue piece 16e made of the flexible insulating plate 16a of the printed circuit board 16 is formed along the periphery of the opening 16d has the following effect. This effect is explained by using FIG. 8 and FIG. 9.

Figure 8:
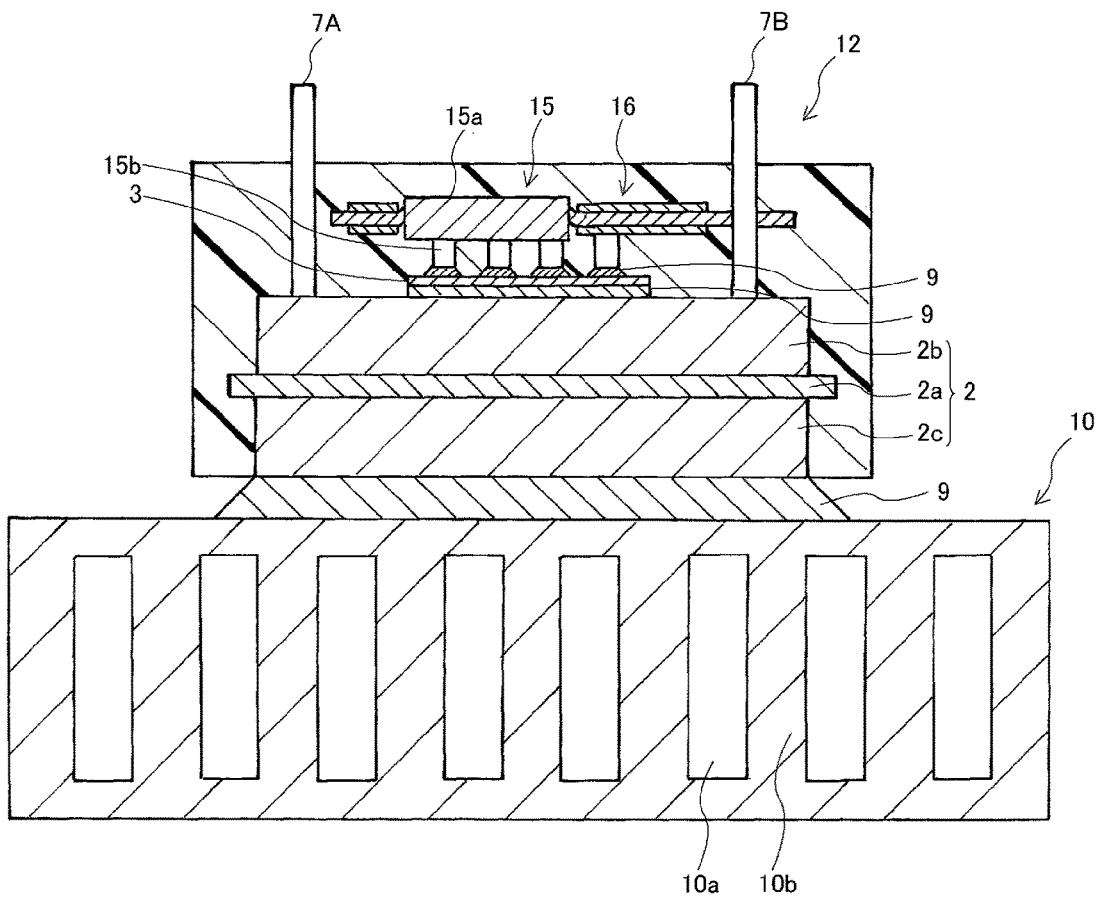
FIG. 8 is a cross-sectional view of a variation of the power semiconductor module of the present invention.
Figure 9:
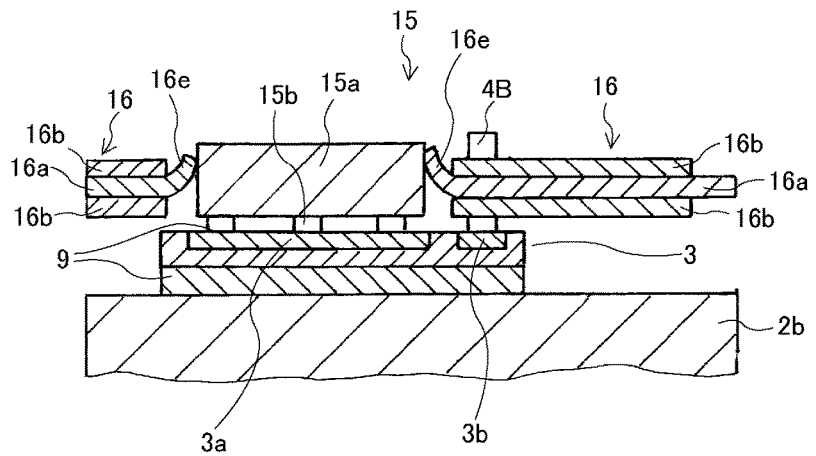
FIG. 9 is a partially enlarged cross-sectional view of FIG. 8.

FIG. 8 is a cross-sectional view of a power semiconductor module 12 of a variation of the power semiconductor module 11, and FIG. 9 is an enlarged cross-sectional view in the vicinity of the metal block 15 and a printed circuit board 16 in the power semiconductor module 12 of FIG. 8. In FIG. 8, FIG. 9, the same symbols are assigned to the same members as those depicted in FIG. 1-7, and the duplicated explanations will be omitted hereinafter.

The power semiconductor module 12 depicted in FIG. 8 and FIG. 9 has an external terminal having a different shape from that of the power semiconductor module 11 depicted in FIG. 3. However, the tongue pieces 16e made of a flexible insulating plate 16a are formed along the periphery of the opening 16d of the printed circuit board 16, as in the case of the power semiconductor module 11.

When the size of the opening 16d of the printed circuit board 16 is smaller than that of the base portion 15a of the metal block 15, the extruded tongue piece 16e formed projectingly leads to a warped state of the tongue piece 16e while kept in contact with the metal block 15, upon putting the metal block 15 through the opening 16d, as shown by the enlarged cross-sectional view in FIG. 9. Thereby, the printed circuit board 16 can be integrally fixed to the metal block 15 while kept aligned thereto. The location of the control electrode 3b can be thus aligned automatically and precisely to that of one end of the conductive post 4B, and consequently, the power semiconductor module with high reliability can be produced at low cost.

In addition, the formed tongue piece 16e also enables alignment and fixation of plural metal blocks 15 with different sizes, using one printed circuit board by warping the tongue piece 16e.

Figure 10:
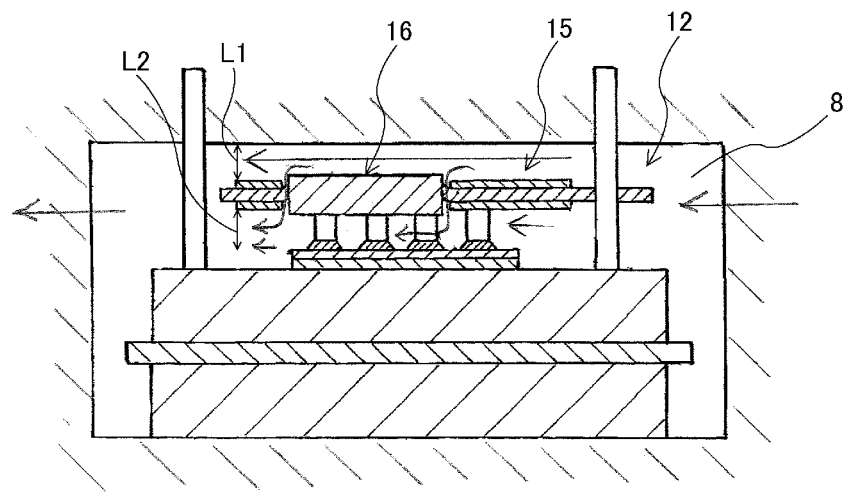
FIG. 10 is a cross-sectional view depicting a flow of sealing resin during molding of the power semiconductor module.

Moreover, in the opening 16d, since portions other than the tongue piece 16e are portions which form a gap when the inserted metal block 15 penetrates the opening 16d, voids generated during molding of seal resin 8 can be reduced. FIG. 10 indicates, by arrows, the flow of the seal resin 8 during molding in the power semiconductor module 12. In the region above the printed circuit board 16, the flow moves at a high speed and in a large amount since the flow is obstructed by a small number of members, and in the region between the printed circuit board 16 and the multi-layered substrate 2, the flow moves at a relatively low speed and in a small amount since it is obstructed by a large number of members. Although the printed circuit board 16 which acts as a boundary is likely to generate voids owing to the difference of the flow, it is a portion in which the gap is formed when the inserted metal block 15 penetrates the opening 16d, and the gap allows the seal resin 8 from the region above the printed circuit board 16 to flow between the printed circuit board 16 and the multi-layered substrate 2. Thereby, voids can be reduced effectively. In such a mold, a distance L1 from the printed circuit board 16 to the upper wall of the mold is about 1.0-3.0 mm, and a distance L2 between the printed circuit board 16 and the multi-layered substrate 2 is about 0.3-2.0 mm. When the distance L1 from the printed circuit board 16 to the upper wall of the mold is 1.0 mm or more, the seal resin 8 is unlikely to crack even if the power semiconductor module 12 deforms by heat among other things. When the distance L1 from the printed circuit board 16 to the upper wall of the mold is 3.0 mm or less, the power semiconductor module can be easily produced, with low cost, and in addition, amount of the distortion of the power semiconductor module 12 can be small, ensuring the reliability. When the distance L2 from the printed circuit board 16 to the multi-layered substrate 2 is 0.3 mm or more, fluidity of the resin is satisfactory and generation of voids can be reduced. When the distance L2 from the printed circuit board 16 to the multi-layered substrate 2 is 2.0 mm or less, a trouble does not happen, such as bending of pins upon their press-fit and that caused by the resin flowing during transfer molding. The ratio of L1 to L2 may be 0.5-10, L1 being the distance from the printed circuit board 16 to the upper wall of the mold, and L2 being the distance between the printed circuit board 16 and the multi-layered substrate 2

Next, a production method of the power semiconductor module 12 of Embodiment 2 is explained.

Figure 11:
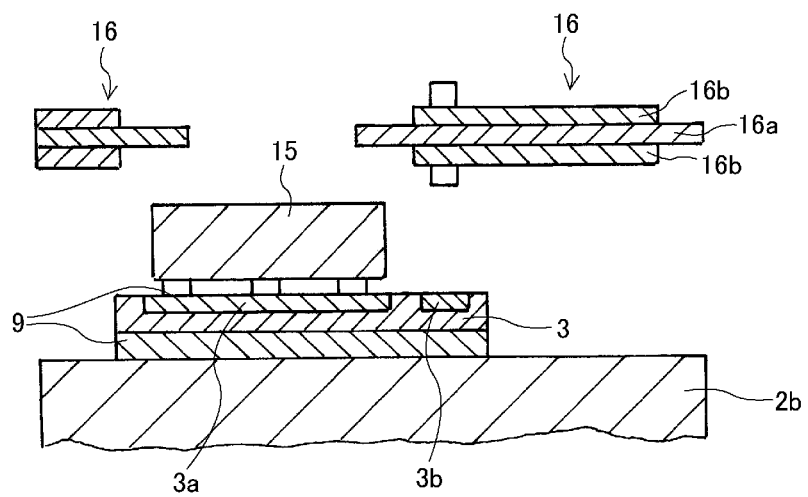
FIG. 11 is an explanatory drawing of a production method of the power semiconductor module of the present invention.

As shown in FIG. 11, the semiconductor chip 3 is bonded by the solder 9 on the circuit plate 2b of the multi-layered substrate 2, and the metal block 15 is bonded by the solder 9 on the semiconductor chip. Bonding the metal block 15 to the semiconductor chip 3 may be carried out after bonding the semiconductor chip 3 to the circuit plate 2b, and bonding the semiconductor chip 3 to the circuit plate 2b and bonding the metal block 15 to the semiconductor chip 3 may be carried out simultaneously.

Then, the metal block 15 is inserted into and put through the opening 16d formed on the printed circuit board 16. As a result, as shown in FIG. 9, the tongue piece 16e formed along the periphery of the opening 16d exhibits a warped form kept in contact with the side surface of the metal block 15.

By such a production process involved, the printed circuit board 16 is integrally fixed to the metal block 15 while kept aligned thereto. Thus, the location of the control electrode 3b can be automatically and precisely aligned to the location of one end of the conductive post 4B, and consequently, the power semiconductor module with high reliability can be produced at low cost.

Further, as a variation of the production method of the power semiconductor module 12 of this embodiment, the production method of the power semiconductor module 1 according to Embodiment 1 can be applied by using members and steps changed as follows.

In other words, the metal block 15 is adopted as a first conductive member 5b. The second wiring substrate 6 (16) is provided with the second insulating substrate 6a (16a) having a front surface and a back surface; the second conductive member 6b (16b) is formed on at least any one of the front surface and the back surface of the second insulating substrate 6a (16a); the opening 6c (16d) is placed on the second insulating substrate 6a (16a); the tongue piece (16e) made of a flexible material is formed along the periphery of the opening 6c (16d). Further, in the step of connecting electrically and mechanically the one end of the conductive post 4B to the control electrode 3b, the second wiring substrate 6 (16) is disposed so as to face the control electrode 3b so that the tongue piece (16e) is warped in contact with the metal block 15.

Figure 12:
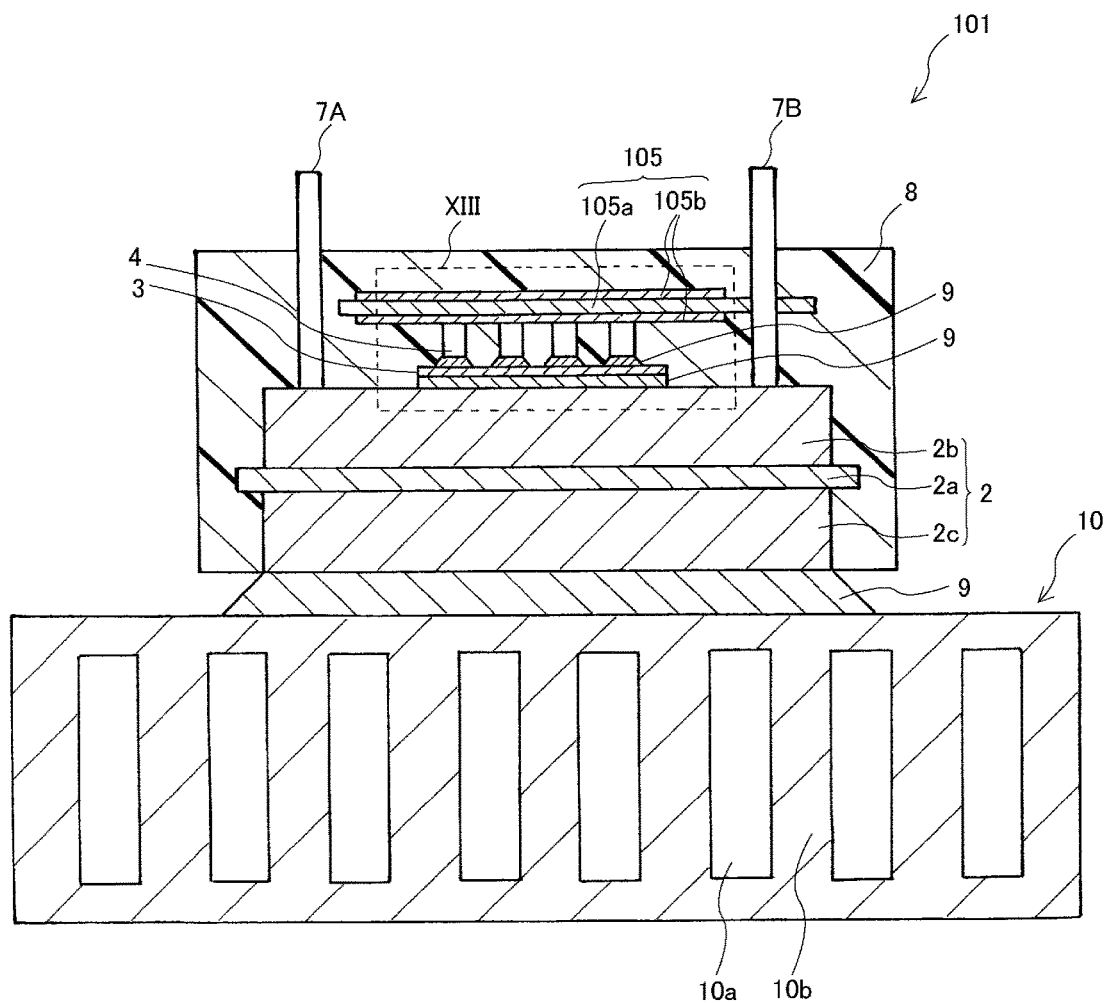
FIG. 12 is a schematical cross-sectional view of a conventional semiconductor device.
Figure 13:
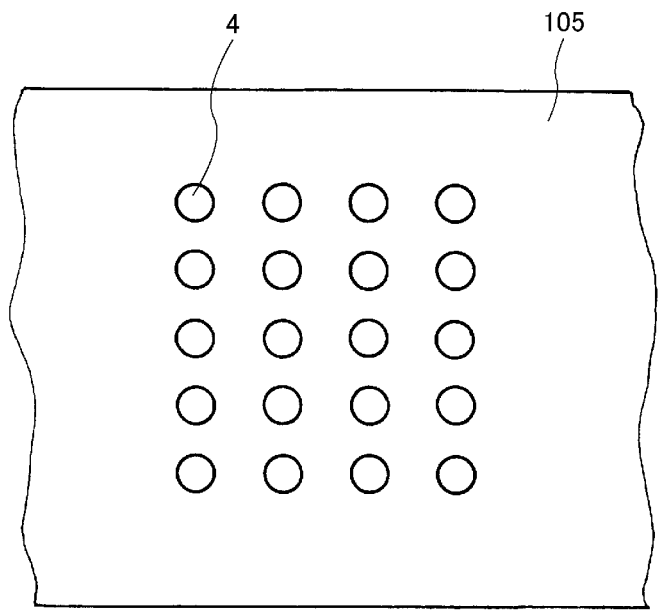
FIG. 13A is a partially enlarged plan view of a main portion of FIG. 12.
FIG. 13B is a partially enlarged cross-sectional view of a main portion of FIG. 12.
Figure 13:
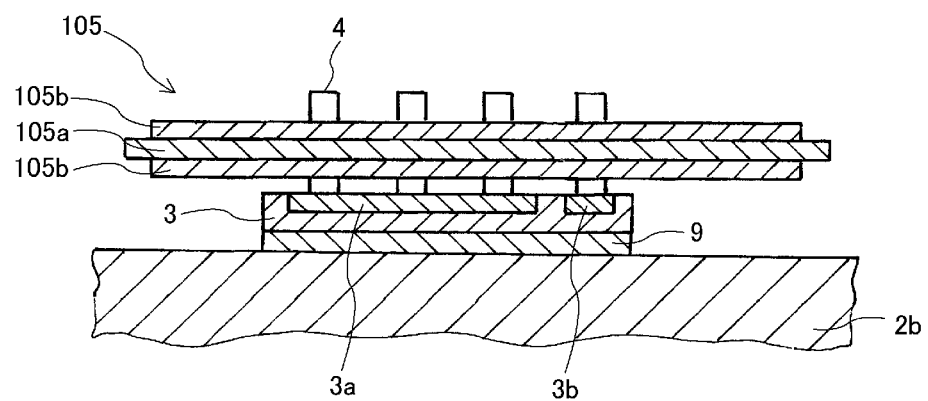

For comparison, a cross-sectional view of a traditional semiconductor device 101 is depicted in FIG. 12, and an enlarged view of a portion of the device indicated by XIII is depicted in FIG. 13B. The semiconductor device 101 depicted in FIG. 12 and FIG. 13A, B is provided with a printed circuit board 105 as a wiring member. The printed circuit board 105 is provided with an insulating substrate 105a and a copper foil 105b, and the copper foil 105b includes a portion facing the main electrode 3a of the semiconductor chip 3 and a portion facing the control electrode 3b, with both of the portions having the same thickness. Accordingly, when large electric current was tried to be passed from the main electrode 3a to the printed circuit board 105, the copper foil 105b was likely to generate heat. When the copper foil 105b was thickened, heat generation of the copper foil 105b was reduced, but on the other hand, it was difficult to form by etching a portion for a circuit to be connected electrically to the control electrode 3b. In addition, even in the case that the etching was able to be carried out, the thickness was wasteful because large electric current is not circulated through the control electrode 3b. In contrast to this, the semiconductor device of the present invention exhibits the excellent effect in comparison to traditional semiconductor devices, as obvious from Embodiment 1 and Embodiment 2.

As described above, although the semiconductor device of the present invention and the production method thereof were specifically explained by using the drawings and the embodiments, the semiconductor device of the present invention is not limited to those described in the embodiments and the drawings, and many variations are allowable without departing from the spirit of the present invention.

DESCRIPTION OF SYMBOLS 1, 11, 12 power semiconductor module (semiconductor device)
2 multi-layered substrate
2a insulating plate
2b circuit plate
2c metal plate
3 semiconductor chip
3a main electrode
3b control electrode 4 conductive post
5 first wiring substrate
6 second wiring substrate
15 metal block
16 printed circuit board

The invention claimed is:

1. A semiconductor device comprising:
a multi-layered substrate provided with an insulating plate and a circuit plate,
a semiconductor chip provided with a front surface and a back surface, the front surface having a main electrode and a control electrode formed thereon, and the back surface being fixed to the circuit plate,
a first wiring substrate which includes a first conductive member, is placed so as to face the main electrode, and is connected electrically to the first conductive member,
a second wiring substrate which includes a second conductive member, is placed so as to face the control electrode, and has an opening extending through the second wiring substrate so that the first wiring substrate is disposed inside the opening,
a conductive post provided with one end and another end, the one end being connected electrically and mechanically to the control electrode, and the another end being connected electrically and mechanically to the second conductive member, and
a seal resin sealing the multi-layered substrate, the semiconductor chip, the first wiring substrate, and the second wiring substrate,
wherein the first conductive member is thicker than the second conductive member,
the first wiring substrate is disposed inside the opening of the second wiring substrate so that a side surface of the first wiring substrate faces an inner side surface of the second wiring substrate defined by the opening of the second wiring substrate, and
the first conductive member of the first wiring substrate and the second conductive member of the second wiring substrate are not connected electrically to each other.

2. The semiconductor device according to claim 1, wherein the first wiring substrate and the second wiring substrate are disposed on a same plane.

3. The semiconductor device according to claim 1, wherein the first wiring substrate is in contact with an internal side of the opening.

4. The semiconductor device according to claim 1, wherein the first wiring substrate is fixed integrally to the second wiring substrate.

5. The semiconductor device according to claim 1, wherein the first wiring substrate comprises a first insulating substrate having a front surface and a back surface, and the first conductive member is formed on at least any one of the front surface and the back surface of the first insulating substrate,
wherein the second wiring substrate comprises a second insulating substrate having a front surface and a back surface, and the second conductive member is formed on at least any one of the front surface and the back surface of the second insulating substrate,
wherein the opening is formed on the second insulating substrate.

6. The semiconductor device according to claim 1, wherein the first conductive member is constituted by a metal block.

7. The semiconductor device according to claim 6, wherein the second wiring substrate comprises a second insulating substrate having a front surface and a back surface, and the second conductive member is formed on at least any one of the front surface and the back surface of the second insulating substrate,
wherein an opening is formed on the second insulating substrate.

8. The semiconductor device according to claim 7, wherein the metal block penetrates the opening and one end of the conductive post is aligned to the control electrode in a location such that the conductive post and the control electrode face each other.

9. The semiconductor device according to claim 8, wherein a tongue piece made of a flexible material is formed along the periphery of the opening, and the tongue piece is warped while kept contact with the metal block.

10. The semiconductor device according to claim 9, comprising a gap between the second insulating substrate and the metal block, wherein the gap is defined by a plurality of the tongue pieces formed along the periphery of the opening.

11. The semiconductor device according to claim 10, wherein the second insulating substrate comprises the flexible material.

12. The semiconductor device according to claim 1, wherein the second wiring substrate is connected to an external terminal.

13. The semiconductor device according to claim 6, wherein the metal block comprises a pin on a surface thereof facing the semiconductor chip, and the pin is connected electrically and mechanically to the main electrode.

14. The semiconductor device according to claim 1, further comprising a plurality of bar-shaped conductive members to electrically connect the semiconductor chip and the first conductive member.

* * * * *